(12) United States Patent
Kang et al.

(10) Patent No.: US 11,676,905 B2
(45) Date of Patent: Jun. 13, 2023

(54) INTEGRATED CIRCUIT (IC) PACKAGE WITH STACKED DIE WIRE BOND CONNECTIONS, AND RELATED METHODS

(71) Applicant: QUALCOMM Incorporated, San Diego, CA (US)

(72) Inventors: Kuiwon Kang, San Diego, CA (US); Michelle Yejin Kim, San Diego, CA (US); Joan Rey Villarba Buot, Escondido, CA (US); Jialing Tong, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/158,374

(22) Filed: Jan. 26, 2021

(65) Prior Publication Data

US 2022/0037257 A1     Feb. 3, 2022

Related U.S. Application Data

(60) Provisional application No. 63/057,552, filed on Jul. 28, 2020.

(51) Int. Cl.
| | | |
|---|---|---|
| H01L 23/538 | (2006.01) | |
| H01L 25/065 | (2023.01) | |
| H01L 23/00 | (2006.01) | |
| H01L 21/48 | (2006.01) | |
| H01L 25/00 | (2006.01) | |

(52) U.S. Cl.
CPC ...... *H01L 23/5386* (2013.01); *H01L 21/4857* (2013.01); *H01L 23/5383* (2013.01); *H01L 24/48* (2013.01); *H01L 24/92* (2013.01); *H01L 25/0652* (2013.01); *H01L 25/0657* (2013.01); *H01L 25/50* (2013.01); *H01L 24/16* (2013.01); *H01L 2224/16227* (2013.01); *H01L 2224/48227* (2013.01); *H01L 2224/92227* (2013.01); *H01L 2225/06568* (2013.01)

(58) Field of Classification Search
CPC ............ H01L 23/5386; H01L 21/4857; H01L 23/5383
See application file for complete search history.

(56) References Cited

U.S. PATENT DOCUMENTS

2010/0193930 A1 *  8/2010  Lee ..................... H01L 24/24
                                                            257/E23.173

FOREIGN PATENT DOCUMENTS

| EP | 3258486 A1 | 12/2017 |
|---|---|---|
| JP | 2009065066 A | 3/2009 |

OTHER PUBLICATIONS

International Search Report and Written Opinion for International Patent Application No. PCT/US2021/038033, dated Oct. 14, 2021, 20 pages.

* cited by examiner

*Primary Examiner* — Errol V Fernandes
(74) *Attorney, Agent, or Firm* — W&T

(57) ABSTRACT

An integrated circuit (IC) package with stacked die wire bond connections has two stacked IC dies, where a first die couples to a metallization structure directly and a second die stacked on top of the first die connects to the metallization structure through wire bond connections. The IC dies are coupled to one another through an interior metal layer of the metallization structure. Vias are used to couple to the interior metal layer.

25 Claims, 14 Drawing Sheets

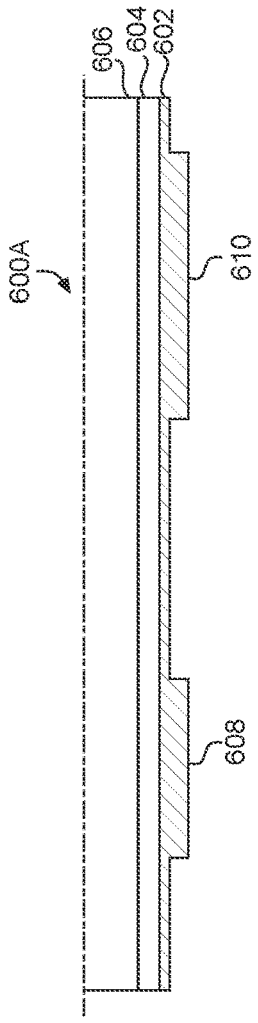
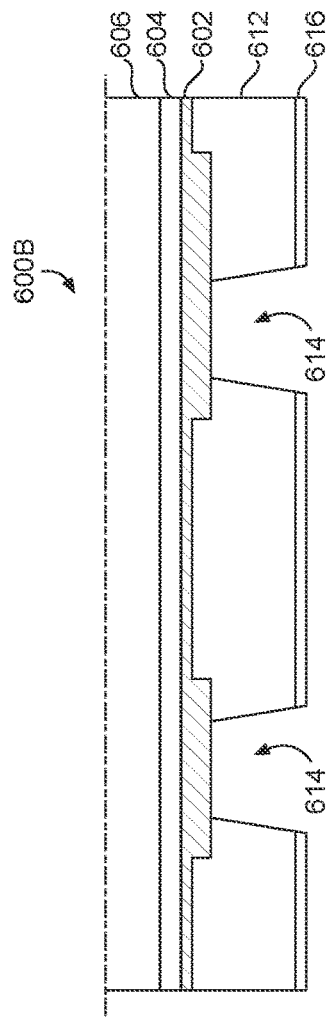
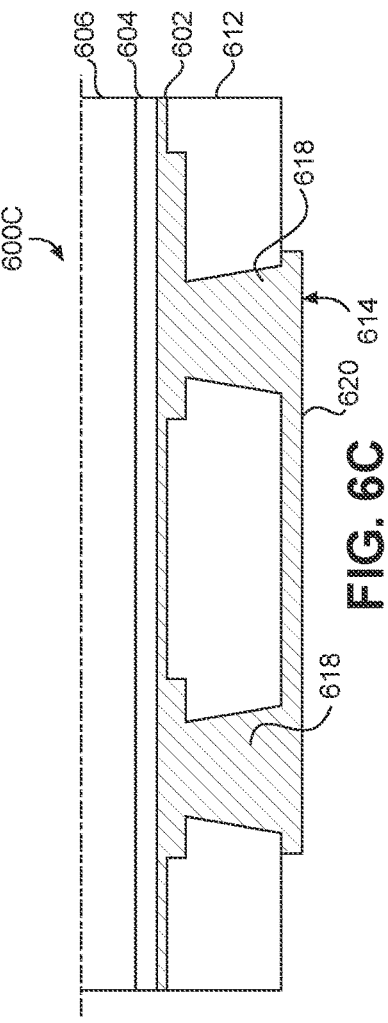
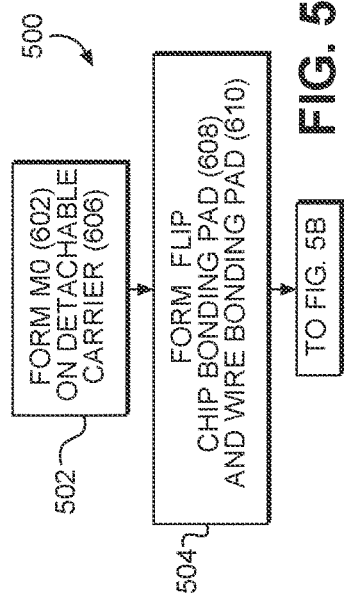
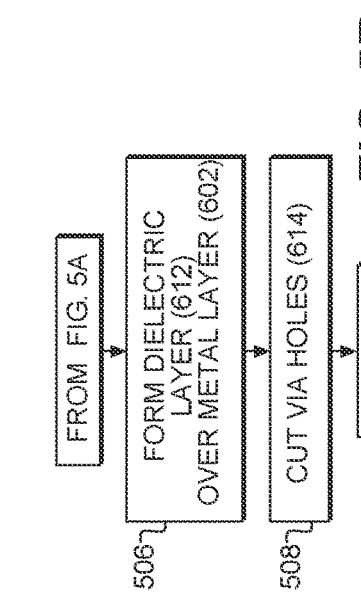

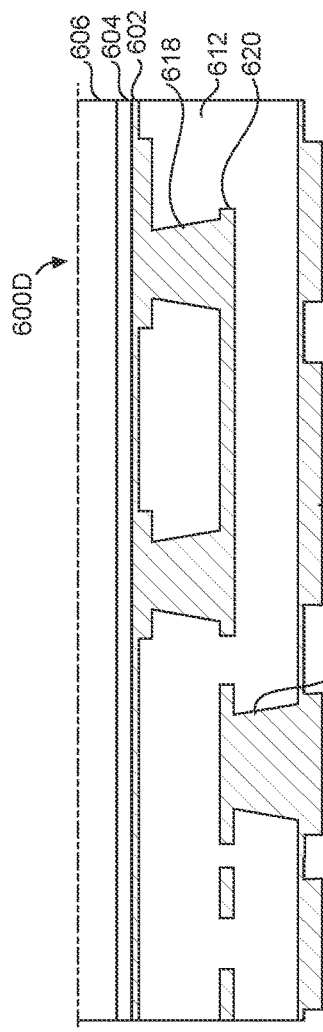
FIG. 6D
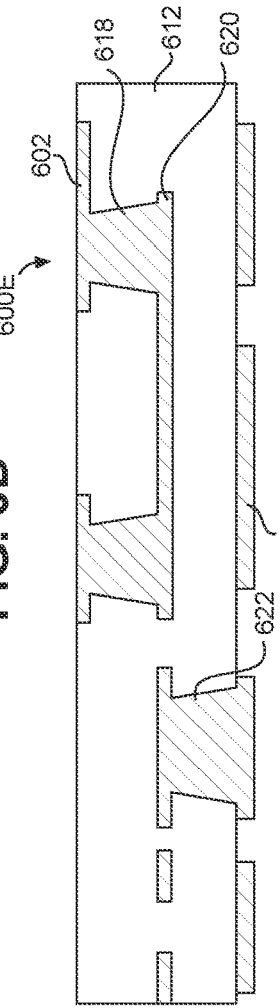
FIG. 6E
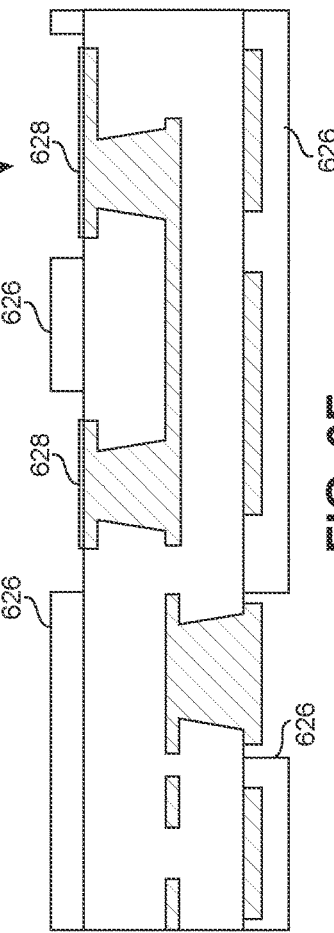
FIG. 6F
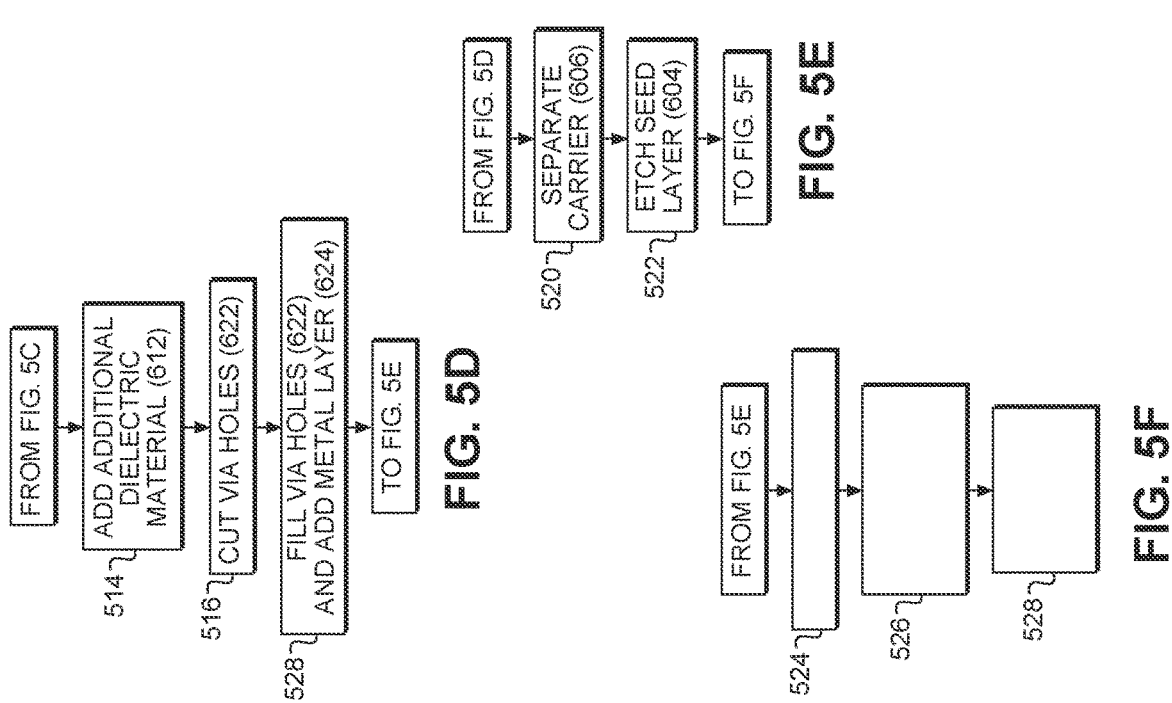
FIG. 5D
FIG. 5E
FIG. 5F

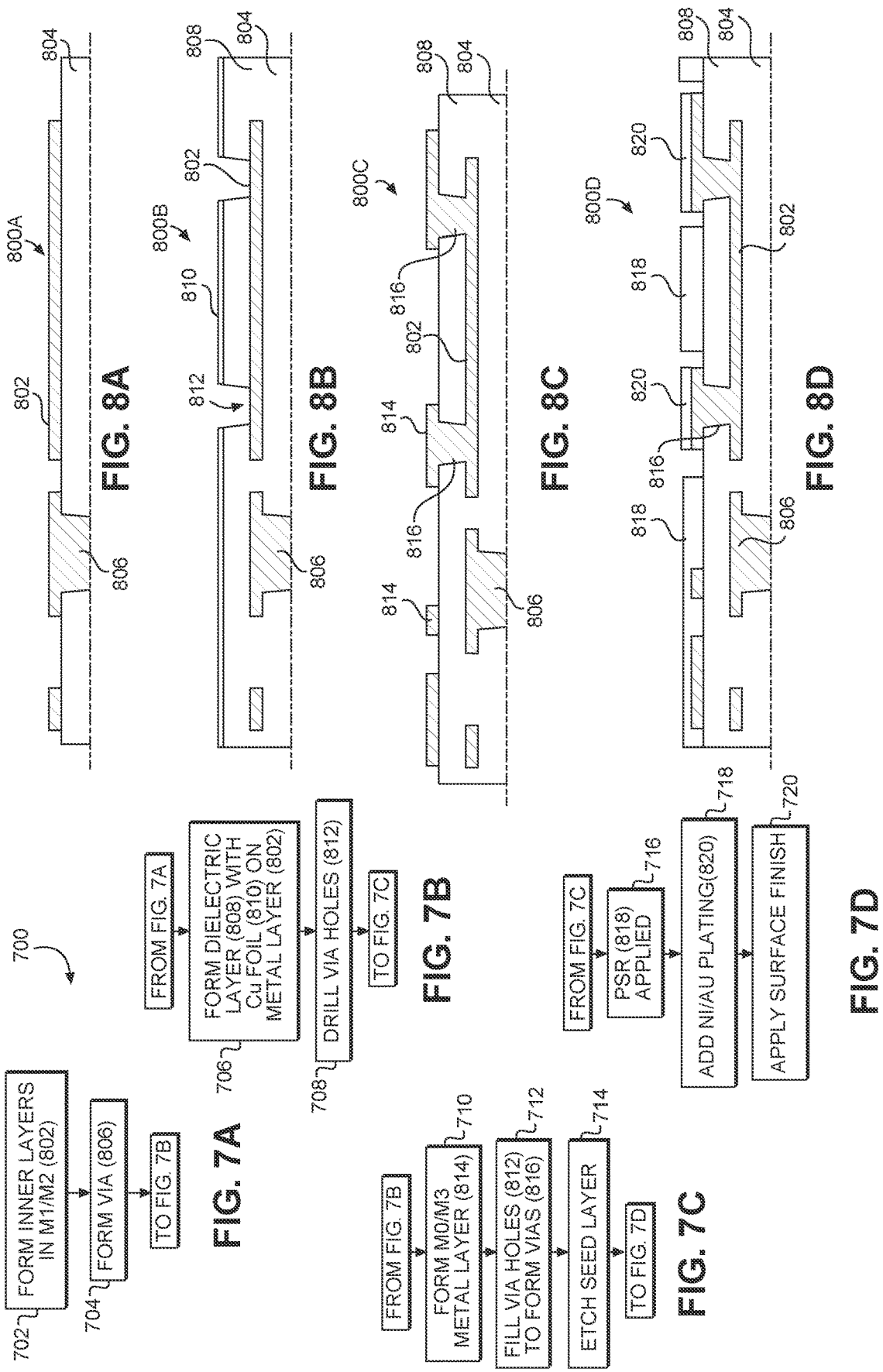

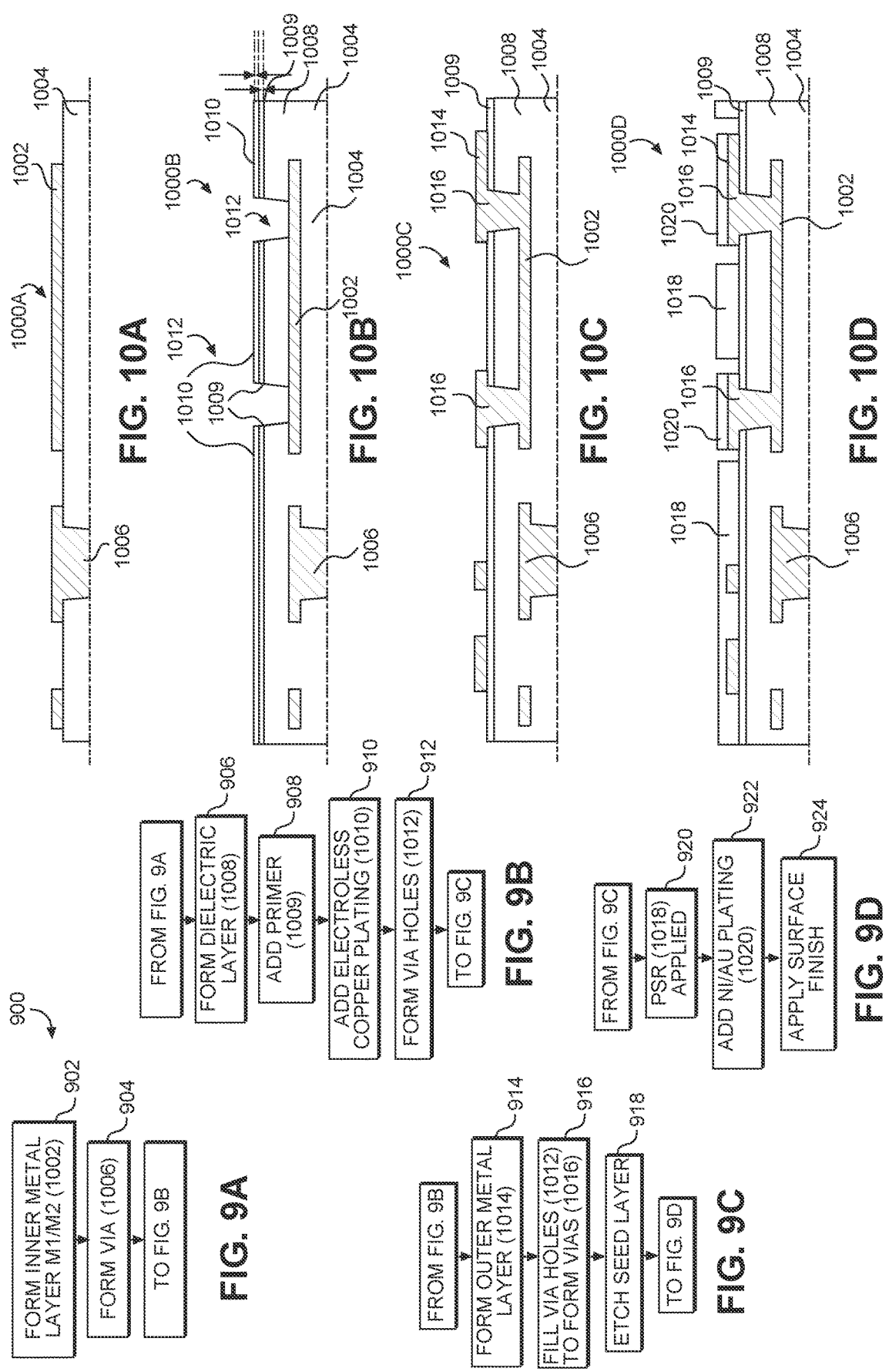

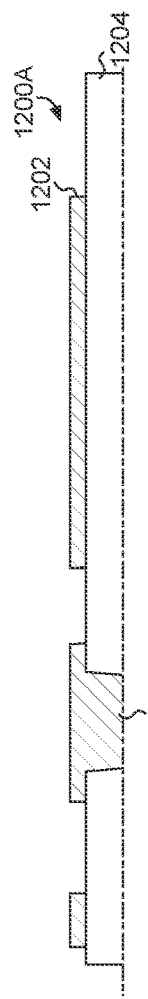
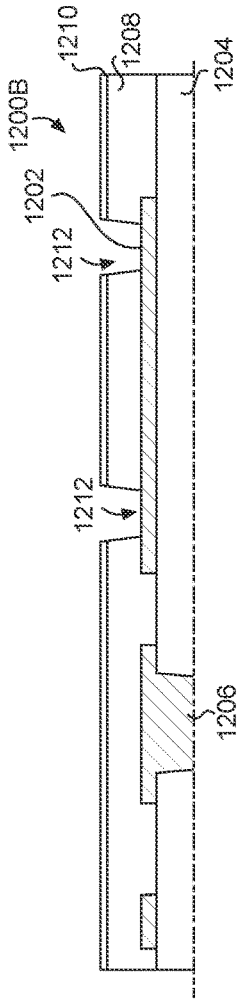
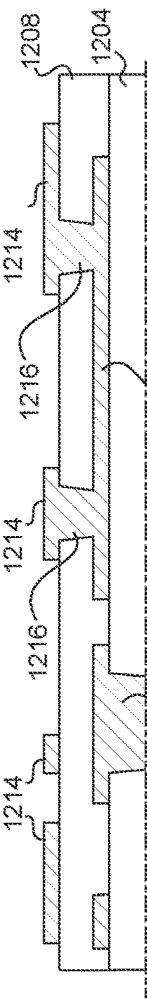
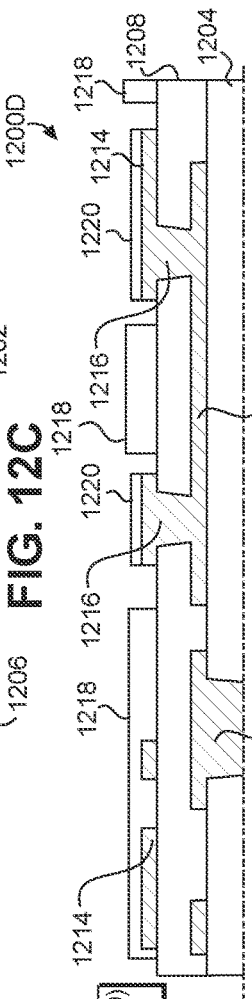
FIG. 12A
FIG. 12B
FIG. 12C
FIG. 12D
FIG. 11A
FIG. 11B
FIG. 11C
FIG. 11D

INTEGRATED CIRCUIT (IC) PACKAGE WITH STACKED DIE WIRE BOND CONNECTIONS, AND RELATED METHODS

PRIORITY CLAIM

The present application claims priority to U.S. Patent Provisional Application Ser. No. 63/057,552 filed on Jul. 28, 2020 and entitled "INTEGRATED CIRCUIT (IC) PACKAGE WITH STACKED DIE WIRE BOND CONNECTIONS, AND RELATED METHODS," the contents of which is incorporated herein by reference in its entirety.

BACKGROUND

I. Field of the Disclosure

The technology of the disclosure relates generally to integrated circuit (IC) packages having multiple dies associated therewith and wire bond connections for such packages.

II. Background

Computing devices, and particularly mobile communication devices, abound in modern society. Such computing devices rely on integrated circuits (ICs) that may be combined into a single package to provide increased functionality. Such packages may include ICs stacked on top of one another and coupled to a substrate, such as a printed circuit board (PCB). In many cases, a first IC is coupled to the substrate through solder bumps or the like while the stacked ICs may be coupled to the substrate through wire bond connections. Demands for increased functionality at increased operating speeds continue, resulting in a need to provide packages with minimal latency. Such demands are particularly acute in mobile computing devices that are subject to the increasingly stringent cellular communication standards.

SUMMARY OF THE DISCLOSURE

Aspects disclosed in the detailed description include an integrated circuit (IC) package with stacked die wire bond connections and related methods. In exemplary aspects, an IC package has two stacked IC dies, where a first die couples to a metallization structure directly and a second die stacked on top of the first die connects to the metallization structure through wire bond connections. The IC dies are coupled to one another through an interior metal layer of the metallization structure. Vias are used to couple to the interior metal layer. By routing through the interior metal layer of the substrate, an overall connection length may be shortened, which in turn reduces resistance and inductance associated with the connection. Reduced resistance and inductance decreases losses associated with resistance and parasitic inductance.

In this regard in one aspect, an integrated circuit (IC) package is disclosed. The IC package includes a metallization structure including a metal layer. The IC package also includes an IC die coupled to the metal layer within the metallization structure through a wire bond connection and a via within the metallization structure.

In another aspect, an IC package is disclosed. The IC package includes a metallization structure. The metallization structure includes a first metal layer and a second metal layer separated from the first metal layer. The IC package also includes a first IC die adjacent to the metallization structure and coupled to the second metal layer. The IC package also includes a second IC die adjacent to the first IC die. The second IC die is coupled to the second metal layer of the metallization structure through a via, wherein the first IC die is coupled to the second IC die through the second metal layer.

In another aspect, a method of fabricating an IC package is disclosed. The method includes forming a metallization structure including a first metal layer and a second metal layer. The method also includes connecting a contact pad in the first metal layer to the second metal layer through a via. The method also includes connecting an IC die to the contact pad through a wire bond connection.

BRIEF DESCRIPTION OF THE FIGURESS

FIGS. 5A-5F illustrate a specific process for fabricating a multiple chip package on an embedded trace substrate type metallization structure;

FIGS. 6A-6F illustrate fabrication stages for the process illustrated in FIGS. 5A-5F;

FIGS. 7A-7D illustrate a specific process for fabricating a multiple chip package on a modified semi-additive process type metallization structure;

FIGS. 8A-8D illustrate fabrication stages for the process illustrated in FIGS. 7A-7D;

FIGS. 9A-9D illustrate a specific process for fabricating a multiple chip package on a semi-additive process with primer type metallization structure;

FIGS. 10A-10D illustrate fabrication stages for the process illustrated in FIGS. 9A-9D;

FIGS. 11A-11D illustrate a specific process for fabricating a multiple chip package on a semi-additive process type metallization structure;

FIGS. 12A-12D illustrate fabrication stages for the process illustrated in FIGS. 11A-11D;

DETAILED DESCRIPTION

Figure 1A:
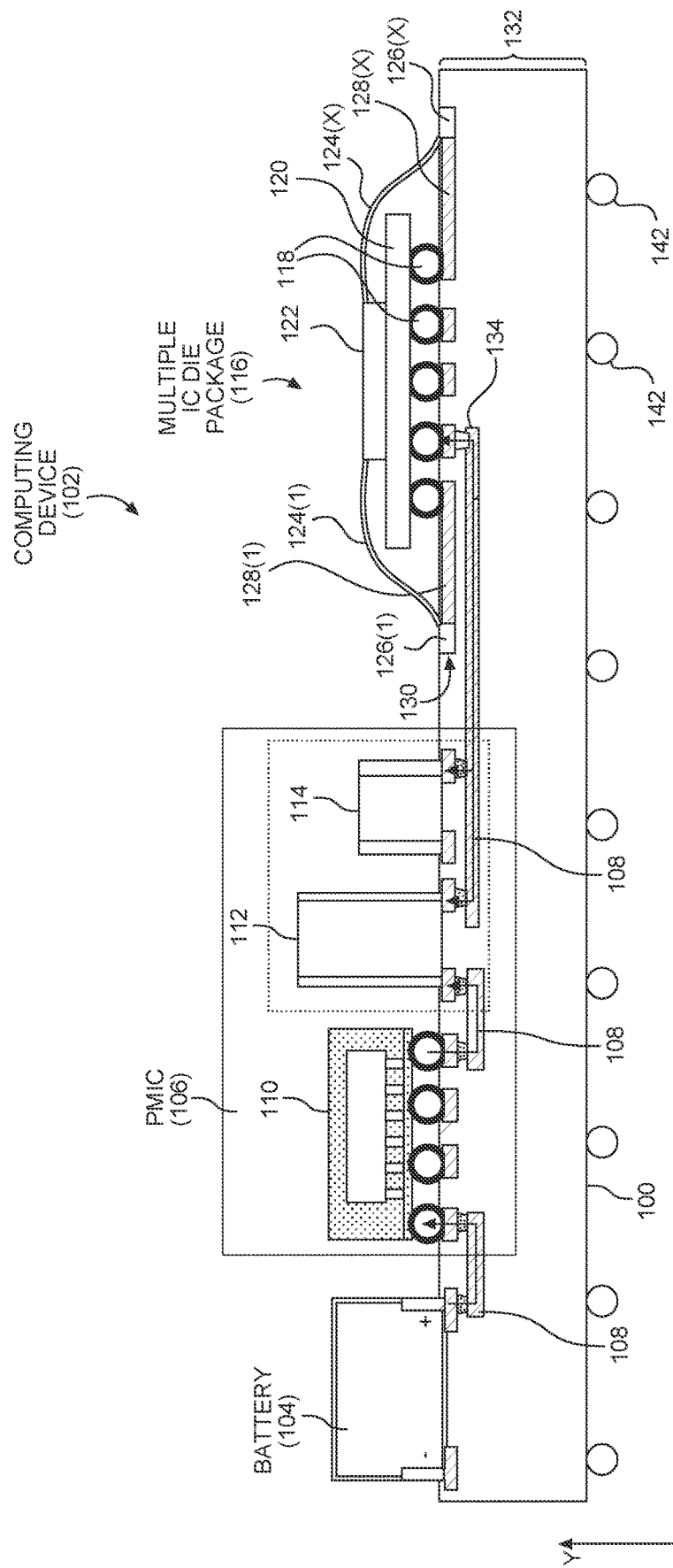
FIG. 1A is a side elevational cross-sectional view of an exemplary conventional circuit board having components thereon.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include an integrated circuit (IC) package with stacked die wire bond connections and related methods. In exemplary aspects, an IC package has two stacked IC dies, where a first die couples to a metallization structure directly and a second die stacked on top of the first die connects to the metallization structure through wire bond connections. The IC dies are coupled to one another through an interior metal layer of the metallization structure. Vias are used to couple to the interior metal layer. By routing through the interior metal layer of the substrate, an overall connection length may be shortened, which in turn reduces resistance and inductance associated with the connection. Reduced resistance and inductance decreases losses associated with resistance and parasitic inductance.

Figure 1B:
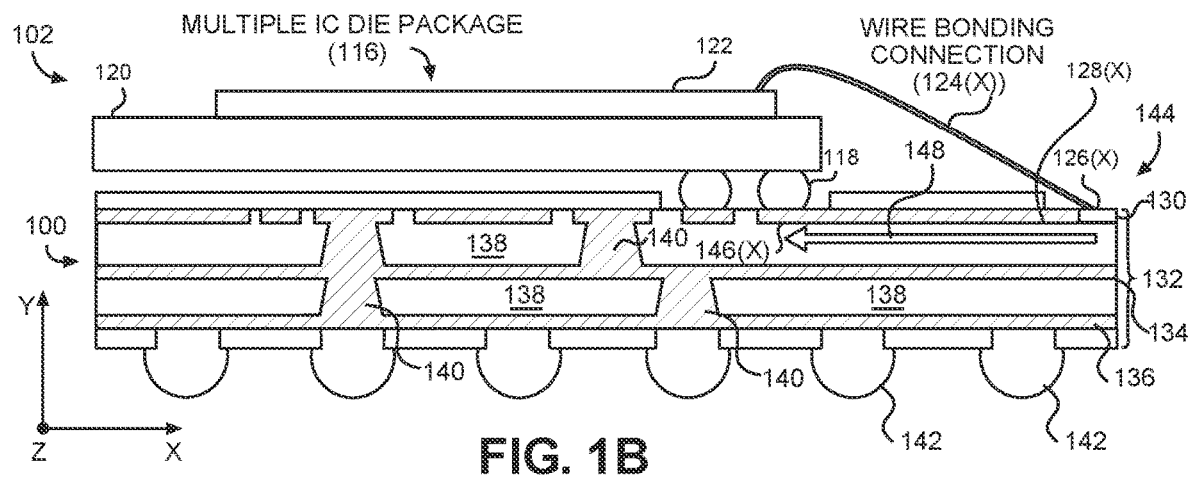
FIG. 1B illustrates a closeup side elevational cross-section of a portion of the circuit board of FIG. 1A with a multiple chip package attached to metal lines within a metallization structure of the circuit board by wire connection bonding.
Figure 1C:
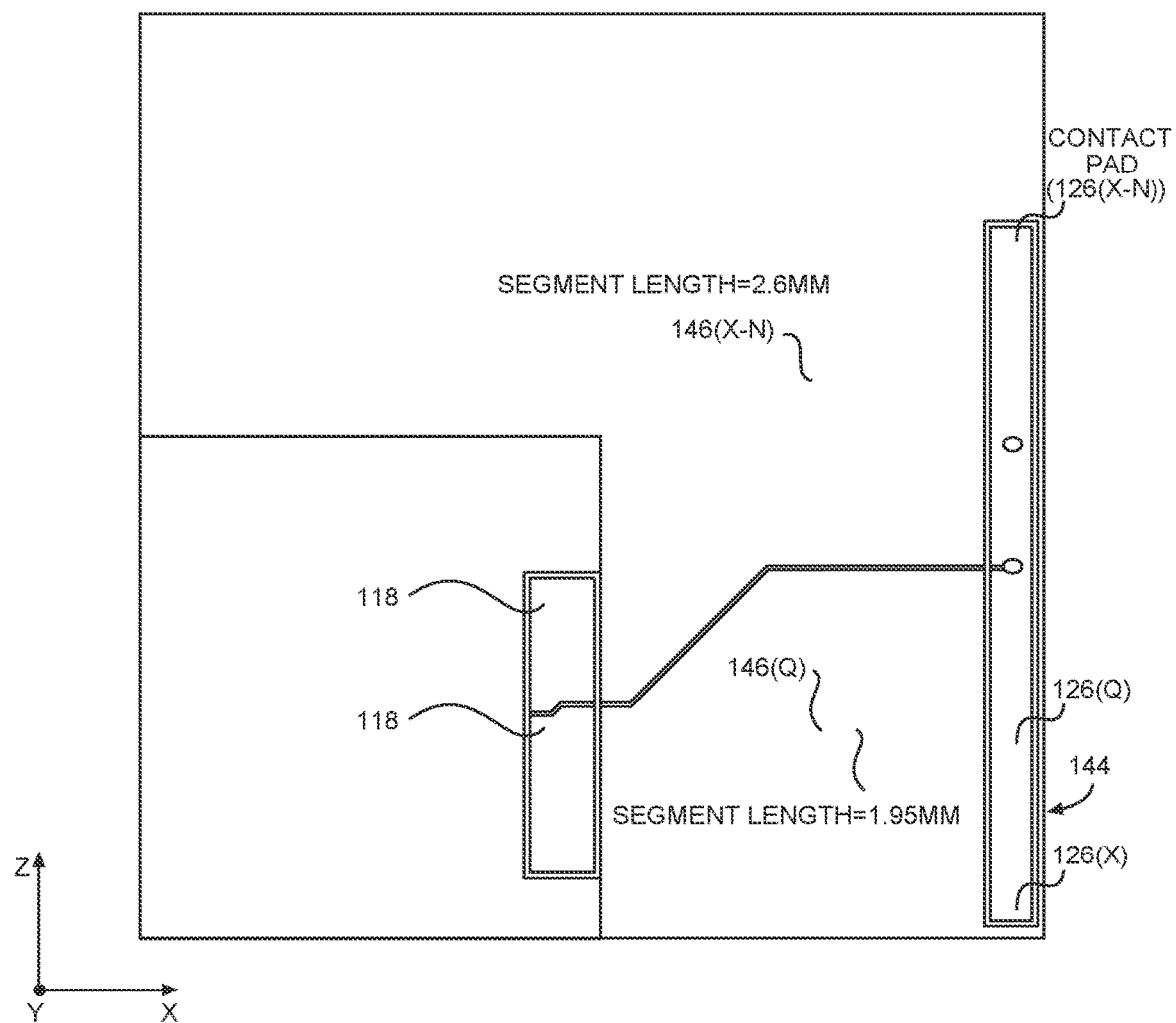
FIG. 1C illustrates a top plan view of a top metal layer of the wiring arrangement of the metallization structure of FIG. 1B.

Before addressing exemplary details of an IC package with stacked die wire bond connections where connection lengths between stacked dies are shortened by routing through interior metal layers of a metallization structure with consequent decreases in resistance and inductance, an overview of a conventional circuit board and conventional stacked die wire bond connections is provided with reference to FIGS. 1A-1C. A discussion of the IC package with stacked die wire bond connections where connection lengths between stacked dies are shortened by routing through interior metal layers of a metallization structure begins below with reference to FIG. 2A.

In this regard, FIG. 1A is a block diagram of an exemplary backplane or circuit board 100 having components thereon including a multiple IC chip package connected to the circuit board 100 by solder bumps and wire connection bonding. In particular, the circuit board 100 may be formed from a substrate such as an embedded trace substrate (ETS), a semi-additive process (SAP) substrate (with or without primer), a modified SAP (mSAP) substrate, or the like.

The circuit board 100 may be part of a larger computing device 102 and may, more specifically, be part of a mobile computing device. Accordingly, a battery 104 may be positioned on (or above in the Y-axis direction) the circuit board 100 and coupled to a power management integrated circuit (IC) (PMC) 106 via metal lines 108. In this regard, the circuit board 100 may include or be a metallization structure. The PMIC 106 may include a switched mode power supply circuit 110 and one or more inductors 112 (one shown) and one or more capacitors 114 (one shown).

A multiple IC die package 116 is coupled to the metal lines 108 through one or more contacts, which may be, in an exemplary aspect, solder bumps 118. The multiple IC die package 116 may include a first IC chip or die 120 and a second IC chip or die 122 mounted on the first die 120 in an adjacent back-to-back arrangement. Back-to-back in this context means that the input/output elements of each respective IC die 120, 122 are on opposite sides of the combined assembly rather than face-to-face where they would be able to connect to each other directly. By way of further reference, the second IC die 122 may be positioned above (in the Y-axis direction) the first IC die 120, which in turn is above (again in the Y-axis direction) the circuit board 100. The second IC die 122 is connected to the circuit board 100 through wire bond connections 124(1)-124(X).

As also seen in FIG. 1B, the wire bond connections 124(1)-124(X) may couple to respective contact pads 126(1)-126(X) on the circuit board 100. The contact pads 126(1)-126(X) may connect to the solder bumps 118 (or other input/output elements) on the first IC die 120 through conductors 128(1)-128(X) in a top or first metal layer 130 (e.g., M0) of the metal lines within a metallization structure 132 of the circuit board 100. The metal lines 108 may also be in the metallization structure 132 of the circuit board 100 and may be in a different metal layer 134 (e.g., M1). One or more additional metal layers 136 (e.g., M2-M8, only one shown) may also be present in the metallization structure 132. The dielectric material 138 may separate the metal layers 130, 134, 136 and the metal layers 130, 134, 136 may be interconnected by vias 140. The circuit board 100 may be coupled to a backplane or other structure (not shown) within the computing device 102 by additional contacts 142 (which may be solder bumps or the like).

In practice, a large percentage of the contact pads 126(1)-126(X) are positioned proximate a distal edge 144 of the metallization structure 132 as seen in FIG. 1C. Note that FIG. 1C does not show the wire bond connections 124(1)-124(X). This positioning of the contact pads 126(1)-126(X) is a function of design constraints which require that much of the top or first metal layer 130 be used for various other elements or components associated with the circuit board 100. In typical arrangements, the contact pads 126(X-N) to 126(X) (as shown in FIG. 1C) may be approximately two millimeters (2 mm) to almost three (3) mm (e.g., as illustrated, 1.95 mm for contact pad 126(Q) to 2.6 mm for contact pad 126(X-N). Consequently, there may be conductors 146(1)-146(X) in the top or first metal layer 130 extending from the distal contact pads 126(1)-126(X) back to the solder bumps 118 (generally shown as arrow 148 in FIG. 1B). The wire bond connections 124(1)-124(X) are at least as long as the conductors 146(1)-146(X) and may be greater as the additional vertical distance traversed adds some distance, which in cases may be non-trivial. Accordingly, the path a signal travels from an input/output on the second IC die 122 goes through the corresponding wire bond connection 124, through the contact pad 126, and back through the conductor 146 to a solder bump 118 on the first IC die 120. Thus, at a minimum, the distance traveled for a given signal is at least twice the length of a corresponding conductor 146.

To the extent the term "approximately" is used herein, the term is defined to be within five percent (5%). For example, approximately one hundred (100) units means between ninety-five (95) and one hundred five (105) units.

As a function of physics and geometry, resistance of the path from the input/output on the second IC die 122 through the corresponding wire bond connection 124, through the contact pad 126, and back through the conductor 146 to a solder bump 118 on the first die 120 is proportional to the distance of that path. The higher the resistance, the greater energy loss through heat generation. While in some contexts, heat generation and energy loss may not be of great import, for mobile computing devices in particular, unnecessary energy loss is undesirable as it may shorten battery life and degrade user experience. Further, inductance of the path from the input/output on the second IC die 122 through the corresponding wire bond connection 124, through the contact pad 126, and back through the conductor 146 to a solder bump 118 on the first IC die 120 is likewise proportional to the distance of the path. Inductance of the path may contribute to reflection losses (i.e., energy reflected back from the destination to the transmitting origin). Such reflection losses may degrade the signal quality as well as contribute to unnecessary energy loss. Accordingly, such reflection losses are undesirable.

Exemplary aspects of the present disclosure provide a multiple chip package on a metallization structure where the wire bond connections from an upper die in the package to the circuit board are much shorter than conventional arrangements. The shorter wire bond connections are possible by routing the connection from a contact pad connected to the wire bond connection to the lower die through an interior metal layer (e.g., M1) within the metallization structure. The interior metal layer generally does not have the same design constraints as the top metal layer and accordingly, the path to the contacts of the lower die may be more direct. Shortening the wire bond connection and the path from the contact pad to the lower die reduces the resistance and the inductance of the path with consequent improvements in performance and less energy loss.

Figure 2A:
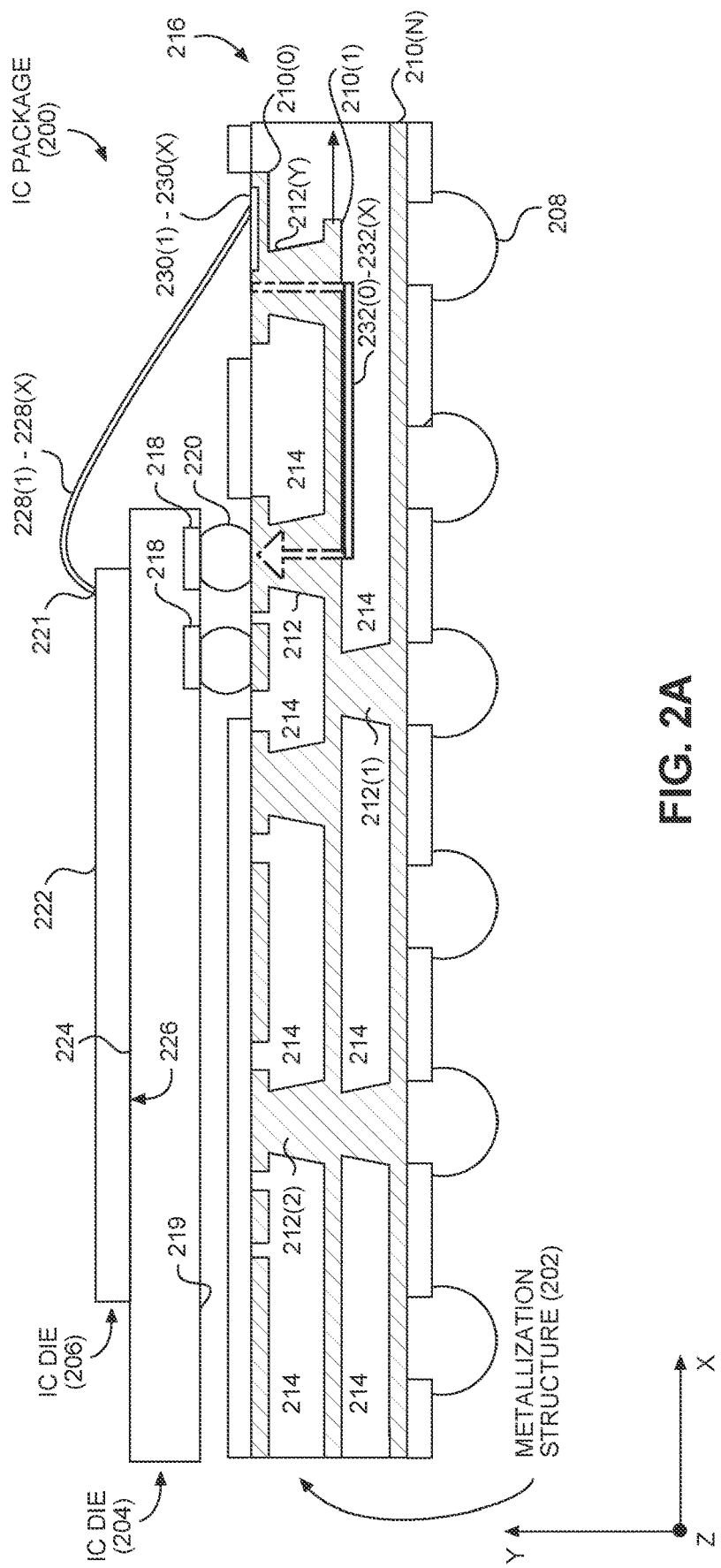
FIG. 2A illustrates a side elevational cross-section of a multiple chip package on a metallization structure with stacked die wire bond connections according to an exemplary aspect of the present disclosure.
Figure 2B:
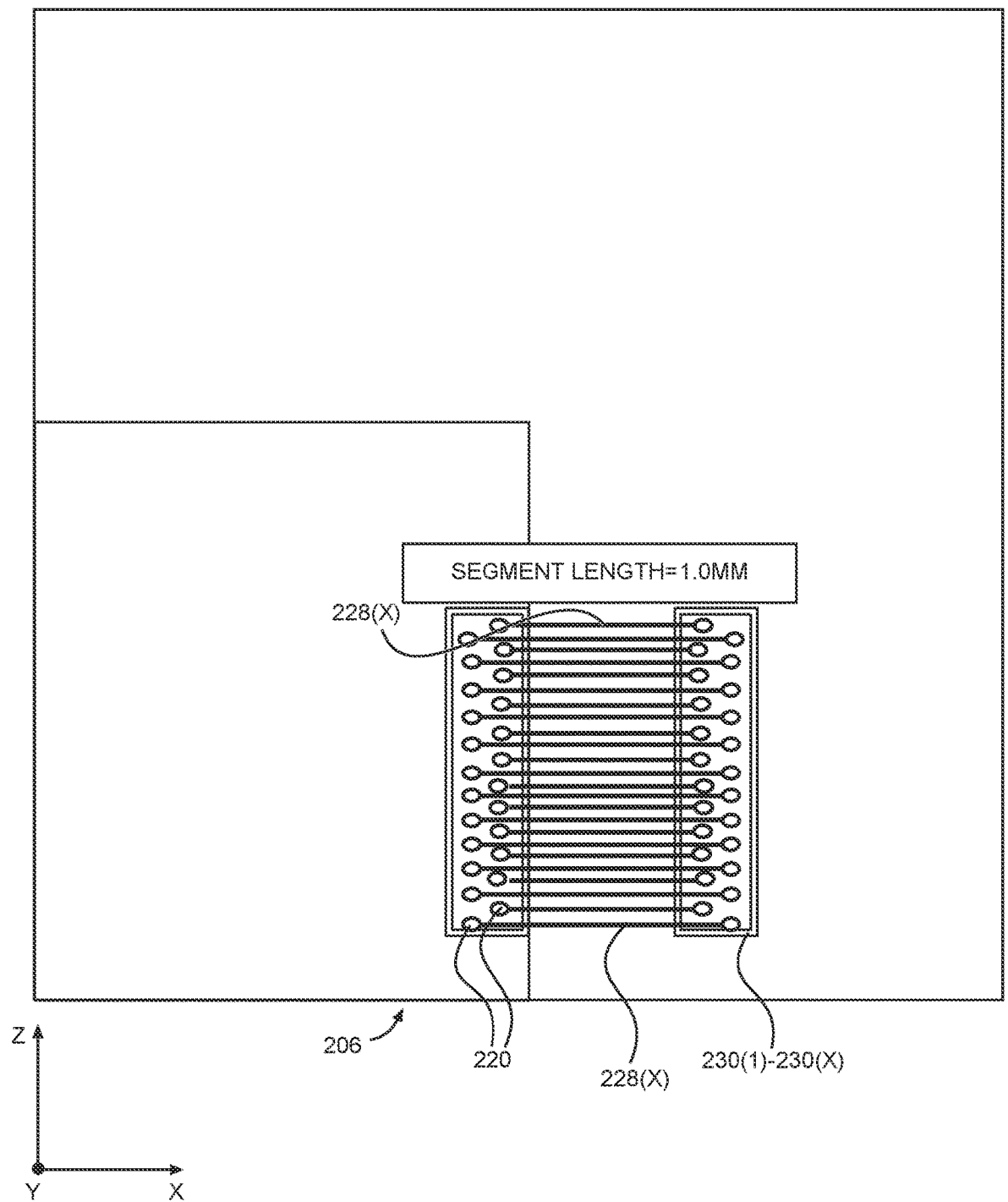
FIG. 2B illustrates a top plan view of the wiring arrangement of the metallization structure of FIG. 2A.

FIG. 2A illustrates a side elevational cross-section of a multiple IC chip package 200 on a metallization structure 202, which may be a circuit board with stacked die wire bond connections according to an exemplary aspect of the present disclosure. FIG. 2B illustrates a top plan view of the wiring arrangement of the metallization structure 202 of FIG. 2A. A first IC chip or die 204 is positioned on the metallization structure 202, and a second IC chip or die 206 is positioned on and adjacent to the first IC chip or die 204. The second IC die 206 may be above (in the Y-axis direction) the first IC die 204, which in turn is above (again, in the Y-axis direction) the metallization structure 202.

The metallization structure 202 may be formed from a substrate such as an ETS, a SAP substrate (with or without primer), an mSAP substrate, or the like and may include external contacts 208, which may be solder bumps or the like and configured to couple the IC package 200 to a backplane or other system level structure. The metallization structure 202 may include a plurality of metal layers 210(0)-210(N) (e.g., metal layers M0-M #N). As used herein, these metal layers 210(0)-210(N) are considered to be "within" the metallization structure 202 in that they lie within the bounds of the metallization structure 202. The M0-M #N nomenclature is common in the industry and, in a typical structure, 'N' may be three or four (3 or 4), although N may be larger without departing from the present disclosure. With reference to the Y axis, the lower numbers are above the higher numbers such that metal layer 210(N) is sometimes referred to as a bottom metal layer and metal layer 210(0) is also referred to as a top metal layer, but all are "within" the metallization structure 202. Ordinal names like "first" and "second" may also be used without departing from the present disclosure, but for ease of reference relative to FIG. 2A, top and bottom will continue to be used. The external contacts 208 may be coupled to the metal layer 210(N). The metal layers 210(0)-210(N) may include metal traces or conductors arranged to form electrical connections and may be coupled to one another by one or more vias 212(1)-212(V). The vias 212(1)-212(V) are also considered to be "within" the metallization structure 202 in that they lie within the bounds of the metallization structure 202. In some cases a given via 212 may vertically connect (e.g., in the Y-axis direction) adjacent metal layers 210(0)-210(N) (e.g., via 212(1) interconnects metal layer 210(N) and metal layer 210(1)) and in other instances, a given via 212(2) may vertically connect the top metal layer 210(0) to the bottom metal layer 210(N). Where there are more than three metal layers, other permutations are possible (e.g., connecting 210(0) to 210(4) skipping 210(1) and 210(2), but also connecting to 210(3) or the like). Dielectric material 214 may separate the metal layers 210(0)-210(N) from one another. The metallization structure 202 may have an exterior edge 216 (e.g., relative to the X-Z plane), and the first IC die 204 may be spaced interiorly of the exterior edge 216.

The first IC die 204 may include interconnects or contacts 218 on a lower or active side 219 that couple interior circuitry and/or interior metal traces (not shown) within the first IC die 204 to the top metal layer 210(0). The interior circuitry and metal traces may be encapsulated in a molding material or the like as is well understood. In an exemplary aspect, the first IC die 204 is in a flip-chip configuration, and solder balls 220 may exist between the contacts 218 and the top metal layer 210(0). In an exemplary aspect, the first die 204 may be a modem or application processor with appropriate circuitry.

The second IC die 206 may include interior circuitry and/or interior metal traces encapsulated by a molding material or the like as is well understood. Exterior contacts 221 may lie on an active or upper surface 222 (in the Y-axis direction) of the second IC die 206. The second IC die 206 may lie above the first IC die 204 and may be positioned in a back-to-back arrangement with the first IC die 204. That is, an inactive or lower surface 224 formed by the encapsulating material of the second IC die 206 may be adjacent to and rest on an inactive or upper surface 226 of the first IC die 204, where the inactive or upper surface 226 is formed by the molding material of the first IC die 204. In an exemplary aspect, the second IC die 206 may be a memory die containing memory circuitry.

Wire bond connections 228(1)-228(X) may extend from the exterior contacts 221 on the second IC die 206 to contact pads 230(1)-230(X) (better seen in FIG. 2B) on the metallization structure 202. The contact pads 230(1)-230(X) couple to the first metal layer 210(0).

In contrast to conventional packages (e.g., such as the one shown in FIGS. 1A-1C), exemplary aspects of the present disclosure do not exclusively use the top metal layer 210(0) to connect the contact pad 230(1)-230(X) to the contacts 218. Rather, as shown in FIG. 2A, vias 212 coupled to the contact pads 230(1)-230(X) connect the top metal layer 210(0) to an interior metal layer such as metal layer 210(1). Respective interior metal traces 232(1)-232(X) then couple to other vias 212 that couple back to the top metal layer 210(0). By routing the connection through a via and an interior metal layer such as metal layer 210(1), the connection bypasses any structures or "activity" in the top metal layer 210(0). Such bypassing allows the contact pads 230(1)-230(X) to be positioned closer to the first IC die 204. In some implementations, such positioning means that the contact pads 230(1)-230(X) are positioned interiorly (e.g., spaced from) of the exterior edge 216 of the metallization structure 202 (see FIG. 2B).

By positioning the contact pads 230(1)-230(X) closer to the first IC die 204, the overall path length for the signal to travel between the second IC die 206 and the first IC die 204 is shortened. Since resistance and inductance for the path are proportional to path length, shortening the path length reduces resistance and inductance with corresponding improvements to performance and reductions in energy loss. In an exemplary aspect, the length of the wire bond connections 228(1)-228(X) is one (1) mm. As an aside, not only are the lengths shortened, they may be made more uniform. By way of comparison, a via 212 is approximately 0.025 mm, so allowing for two vias 212, a wire bond connection 228, and a metal trace 232, a total path distance may be approximately 2.05 mm. In comparison, conventional systems may have a total path of approximately 3.9-5.2 mm (wire bond connection 124 plus the metal conductor 146). Again, by way of comparison, the resistance may change from approximately 500 milliohms (mΩ) to 280 mΩ, which may correspond to approximately a 0.1 decibel (dB) reduction in conductor losses at 2100 megahertz (MHz). Similarly, the inductance may be reduced from approximately 2 nanoHenries (nH) to 1.2 nH, which may correspond to approximately a 7.3 dB reduction in reflection loss at 2100 MHz. Other frequencies may result in different savings. Likewise, these comparisons are based on an initial wire bond connection 124 length of 2.6 mm. Comparisons to longer wire bond connections would result in greater savings.

While the terms like "above," "below," "upper," "lower," "top," and "bottom" are used herein with reference to specific axes, it should be appreciated that such terms are used to assist the reader in understanding the relative positions of elements within the associated Figures and are not intended to impose an absolute orientation. For example, the relative positions of the dies 204, 206 would remain the same regardless of whether a mobile phone containing the IC package 200 were lying face down, face up, held vertically, or held horizontally. However, in each of these different positions, terms like "up," "down," "upper," or "lower" may change. It should be appreciated that ordinal labels (e.g., first, second, third, etc.) may equivalently be used in place of such terms.

The benefits of the stacked die wire bond connections of the present disclosure (e.g., path shortening with corresponding reductions in resistance and inductance) are not limited to two stacked dies. Rather, as illustrated in FIGS. 3A and 3B, three (or more) stacked dies may utilize the stacked die wire bond connections of the present disclosure with corresponding improvements in reduced resistance and inductance.

Figure 3A:
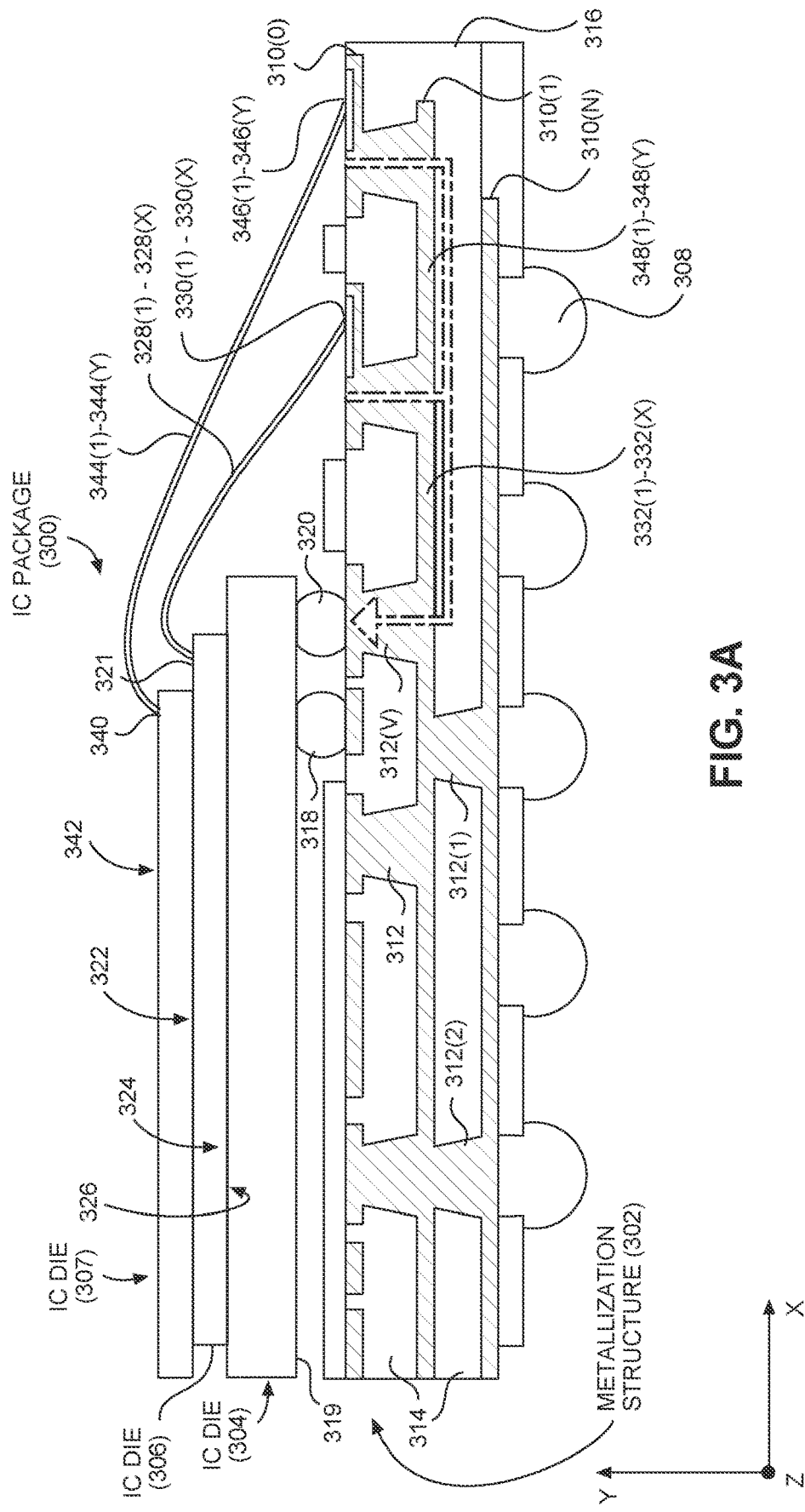
FIG. 3A illustrates a side elevational cross-section of a three chip package on a metallization structure with stacked die wire bond connections according to an exemplary aspect of the present disclosure.
Figure 3B:
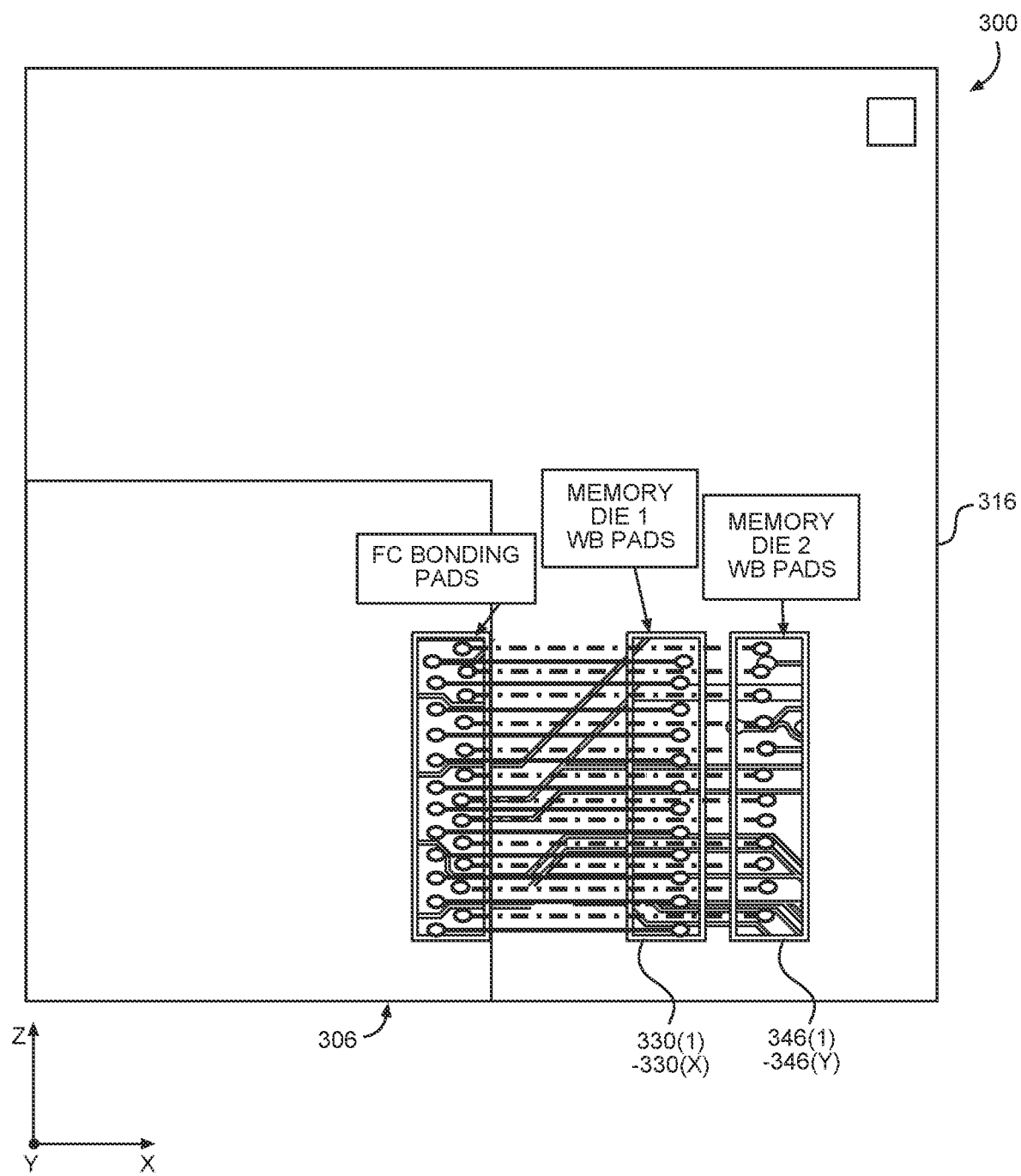
FIG. 3B illustrates a top plan view of the wiring arrangement of the metallization structure of FIG. 3A.

In this regard, FIG. 3A illustrates a side elevational cross-section of a three chip package on a metallization structure with stacked die wire bond connections according to an exemplary aspect of the present disclosure while FIG. 3B illustrates a top plan view of the wiring arrangement of the metallization structure of FIG. 3A. In particular, FIG. 3A illustrates an IC package 300 and specifically a multiple stacked die IC package having a metallization structure 302, which may be a circuit board, a first IC chip or die 304 and a second IC chip or die 306. The second IC die 306 may be above (in the Y-axis direction) the first IC die 304, which in turn is above (again, in the Y-axis direction) the metallization structure 302. A third IC die 307 may be positioned above and resting on the second IC die 306.

The metallization structure 302 may be formed from a substrate such as an ETS, a SAP substrate (with or without primer), an mSAP substrate, or the like and may include external contacts 308, which may be solder bumps or the like and configured to couple the IC package 300 to a backplane or other system level structure. The metallization structure 302 may include a plurality of metal layers 310(0)-310(N) (e.g., metal layers M0-M #N). The M0-M #N nomenclature is common in the industry and, in a typical structure, 'N' may be three or four (3 or 4), although N may be larger without departing from the present disclosure. With reference to the Y axis, the lower numbers are above the higher numbers such that metal layer 310(N) is sometimes referred to as a bottom metal layer and metal layer 310(0) is also referred to as a top metal layer. Again, ordinal names like first and second may also be used, but for ease of reference relative to FIG. 3, top and bottom will be used. The external contacts 308 may be coupled to the metal layer 310(N). Metal layers 310(0)-310(N) may include metal traces or conductors arranged to form electrical connections and may be coupled to one another by one or more vias 312(1)-312(V). In some cases a given via 312 may vertically connect (e.g., in the Y-axis direction) adjacent metal layers 3110(0)-310(N) (e.g., via 312(1) interconnects metal layer 310(N) and metal layer 310(1)) and in other instances, a given via 312(2) may vertically connect the top metal layer 310(0) to the bottom metal layer 310(N). Where there are more than three metal layers, other permutations are possible (e.g., connecting 310(0) to 310(4) skipping 310(1) and 310(2), but also connecting to 310(3) or the like). Dielectric material 314 may separate the metal layers 310(0)-310(N) from one another. The metallization structure 302 may have an exterior edge 316 (e.g., relative to the X-Z plane) and the first die 304 may be spaced interiorly of the exterior edge 316.

The first IC die 304 may include interconnects or contacts 318 on a lower or active side 319 that couple interior circuitry and/or interior metal traces (not shown) within the first IC die 304 to the top metal layer 310(0). The interior circuitry and metal traces may be encapsulated in a molding material or the like as is well understood. In an exemplary aspect, the first IC die 304 is in a flip-chip configuration, and solder balls 320 may exist between the contacts 318 and the top metal layer 310(0). In an exemplary aspect, the first IC die 304 may be a modem or application processor with appropriate circuitry.

The second IC die 306 may include interior circuitry and/or interior metal traces encapsulated by a molding material or the like as is well understood. Exterior contacts 321 may lie on an active or upper surface 322 (in the Y-axis direction) of the second IC die 306. The second IC die 306 may lie above the first IC die 304 and may be positioned in a back-to-back arrangement with the first IC die 304. That is, an inactive or lower surface 324 formed by the encapsulating material of the second IC die 306 may be adjacent to and rest on an inactive or upper surface 326 of the first IC die 304, where the inactive or upper surface 326 is formed by the molding material of the first IC die 304. In an exemplary aspect, the second IC die 306 may be a memory die containing memory circuitry.

Wire bond connections 328(1)-328(X) may extend from the exterior contacts 321 on the second IC die 306 to contact pads 330(1)-330(X) (better seen in FIG. 3B) on the metallization structure 302. The contact pads 330(1)-330(X) couple to the first metal layer 310(0).

Vias 312 coupled to the contact pads 330(1)-330(X) connect the top metal layer 310(0) to an interior metal layer such as metal layer 310(1). Respective interior metal traces 332(1)-332(X) then couple to other vias 312 that couple back to the top metal layer 310(0). By routing the connection through an interior metal layer such as metal layer 310(1), the connection bypasses any structures or "activity" in the top metal layer 310(0). Such bypassing allows the contact pads 330(1)-330(X) to be positioned closer to the first IC die 304. In some implementations, such positioning means that the contact pads 330(1)-330(X) are positioned interiorly (e.g., spaced from) of the exterior edge 316 of the metallization structure 302 (see FIG. 3B).

Similarly, the third IC die 307 may include interior circuitry and/or interior metal traces encapsulated by a molding material or the like as is well understood. Exterior contacts 340 may lie on an active or upper surface 342 (in the Y-axis direction) of the third IC die 307. The third IC die 307 may lie above the second IC die 306. In an exemplary aspect, the third IC die 307 may be a memory die containing memory circuitry.

Wire bond connections 344(1)-344(Y) may extend from exterior contacts 340 on the third IC die 307 to contact pads 346(1)-346(Y) (better seen in FIG. 3B) on the metallization structure 302. The contact pads 346(1)-346(Y) couple to the first metal layer 310(0).

Vias 312 coupled to the contact pads 346(1)-346(Y) connect the top metal layer 310(0) to an interior metal layer such as metal layer 310(1). Respective interior metal traces 348(1)-348(Y) then couple to other vias 312 that couple back to the top metal layer 310(0). By routing the connection through an interior metal layer such as metal layer 310(1), the connection bypasses any structures or "activity" in the top metal layer 310(0). Such bypassing allows the contact pads 346(1)-346(Y) to be positioned closer to the first IC die 304. In some implementations, such positioning means that the contact pads 346(1)-346(Y) are positioned interiorly (e.g., spaced from) of the exterior edge 316 of the metallization structure 302 (see FIG. 3B).

As with the IC package 200 of FIGS. 2A and 2B, the movement of the contact pads 330, 346 in the IC package 300 shortens the path for signals and has corresponding decreases in resistance and inductance, resulting in less energy loss and improved performance.

Figure 4:
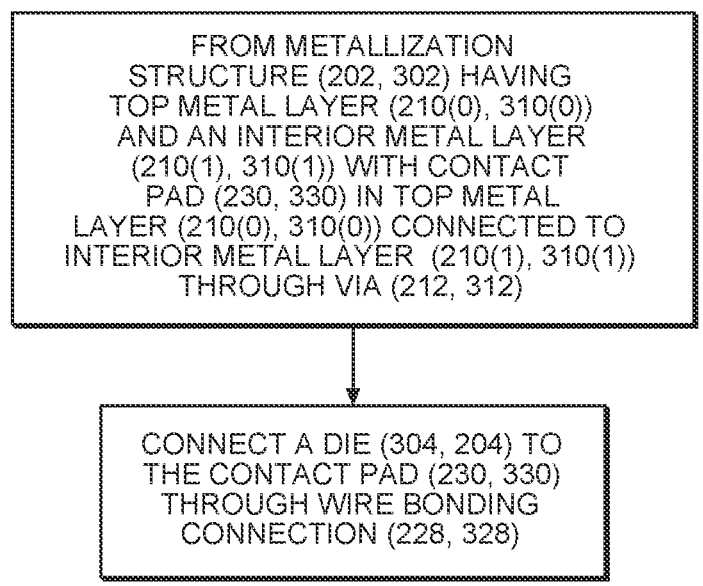
FIG. 4 is a flowchart illustrating an exemplary process for fabricating a multiple chip package having stacked wire bond connections according to an exemplary aspect of the present disclosure.

FIG. 4 is a flowchart illustrating an exemplary process 400 for fabricating a multiple chip package (e.g., the IC package 200 or 300) having stacked wire bond connections. The process 400 begins by forming a substrate or metallization structure 202, 302 that has a top metal layer 210(0), 310(0) and an interior metal layer 210(1), 310(1), wherein a contact pad 230, 330 in the top metal layer 210(0), 310(0) is connected to the interior metal layer 210(1), 310(1) through a via 212, 312 (block 402). The process 400 continues by connecting an IC die 204, 304 to the contact pad 230, 330 through a wire bond connection 228, 328 (block 404). More details about forming various types of metallization structures 202, 302 are provided below with reference to FIGS. 6A-12D along with details about how the vias are formed therein relative to the metal layers.

In this regard, FIGS. 5A-5F illustrate a specific process 500 for fabricating a multiple chip package on an ETS substrate type metallization structure 202, 302 while FIGS. 6A-6F illustrate fabrication stages for the process 500 illustrated in FIGS. 5A-5F. Thus, the process 500 starts by forming a first metal layer (M0) 602 on a seed layer 604 of a detachable carrier 606 (block 502) such as by copper plating. Then a flip-chip bonding pad 608 and wire bonding pad 610 are formed (block 504) as by lithography to form fabrication stage 600A shown in FIG. 6A. A pre-impregnated dielectric layer 612 is then formed over the first metal layer 602 (block 506) such as by lamination. Via holes 614 are then cut into the dielectric layer 612. (block 508) such as by a laser (not shown) and using seed layer or masks 616 to form fabrication stage 600B of FIG. 6B. In an exemplary aspect, the via holes 614 may be blind via holes (BVHs), where the finished vias may be referred to as blind vias. A blind via is a via that starts on one side of the substrate (e.g., PCB), but does not pass all the way through the substrate. Similarly, a BVH is a hole that starts on one side of the substrate and does not pass all the way through the substrate.

The process 500 continues by filling the via holes 614 to form vias 618 (e.g., a blind via) and forming an interior metal layer 620 (block 510) such as by copper plating. The seed layer or masks 616 are then etched (block 512) to form fabrication stage 600C of FIG. 6C. Additional dielectric material 612 is added (block 514) such as by lamination. Via holes 622 are cut (block 516) such as by a laser (not shown), and the via holes 622 are filled while another metal layer 624 is added (block 518) such as by copper plating to form fabrication stage 600D of FIG. 6D.

The process 500 continues by separating the carrier 606 (block 520) and etching the seed layer 604 (block 522) to form fabrication stage 600E of FIG. 6E. A photoimageable solder resist (PSR) 626 is applied (block 524) and contact pads 608, 610 are finished by adding a nickel/gold (Ni/AU) plating 628 (block 526) and a surface finish is applied (block 528) to form metallization layer 600F of FIG. 6F.

FIGS. 7A-7D illustrate a specific process 700 for fabricating a multiple chip package on an mSAP type metallization structure while FIGS. 8A-D illustrate fabrication stages for the process 700 illustrated in FIGS. 7A-7D. In this regard, the process 700 begins by forming inner metal layers M1/M2 802 on a dielectric core 804 (block 702) such as by lithography. Vias 806 are formed (block 704) to form fabrication stage 800A shown in FIG. 8A. A pre-impregnated dielectric layer 808 is formed with a copper foil 810 thereon on top of the metal layer 802 (block 706). Via holes 812 are drilled (block 708) such as by a laser (not shown) to form fabrication stage 800B shown in FIG. 8B.

An outer metal layer M0/M3 814 is formed (block 710) and via holes 812 are filled to form vias 816 (block 712) such as by copper plating. A seed layer is etched (block 714) to form fabrication stage 800C of FIG. 8C. A PSR 818 is applied (block 716) and contact pads are finished by adding Ni/Au plating 820 (block 718) and a surface finish is applied to form metallization layer 800D of FIG. 8D.

FIGS. 9A-9D illustrate a specific process 900 for fabricating a multiple chip package on a SAP with primer type metallization structure while FIGS. 10A-10D illustrate fabrication stages for the process 900 illustrated in FIGS. 9A-9D. In this regard, the process 900 begins by forming inner metal layers M1/M2 1002 on a dielectric core 1004 (block 902) such as by lithography. Vias 1006 are formed (block 904) to form fabrication stage 1000A shown in FIG. 10A. A pre-impregnated dielectric layer 1008 is formed (block 906). A primer 1009 is added (block 908) and an electroless copper plating 1010 is added (block 910). Via holes 1012 are drilled (block 912) such as by a laser (not shown) to form fabrication stage 100013 shown in FIG. 10B.

An outer metal layer M0/M3 1014 is formed (block 914) and the via holes 1012 are filled to form vias 1016 (block 916) such as by copper plating. A seed layer is etched (block 918) to form fabrication stage 10000 of FIG. 10C. A PSR 1018 is applied (block 920) and contact pads are finished by adding Ni/Au plating 1020 (block 922) and a surface finish is applied (block 924) to form metallization layer 1000D of FIG. 10D.

FIGS. 11A-11D illustrate a specific process 1100 for fabricating a multiple chip package on a SAP type metallization structure while FIGS. 12A-12D illustrate fabrication stages for the process 1100 illustrated in FIGS. 11A-11D. In this regard, the process 1100 begins by forming inner metal layers M1/M2 1202 on a dielectric core 1204 (block 1102) such as by lithography. Vias 1206 are formed (block 1104) to form fabrication stage 1200A shown in FIG. 12A. An Ajinomoto Buildup Film (ABF) 1208 is laminated onto the dielectric core 1204 (block 1106). Electroless copper plating 1210 is added (block 1108). Via holes 1212 are drilled (block 1110) such as by a laser (not shown) to form fabrication stage 1200B shown in FIG. 12B.

An outer metal layer M0/M3 1214 is formed (block 1112) such as by lithography, and the via holes 1212 are filled to form vias 1216 (block 1114) such as by copper plating. A seed layer is etched (block 1116) to form fabrication stage 1200C of FIG. 12C. A PSR 1218 is applied (block 1118) and contact pads are finished by adding Ni/Au plating 1220 (block 1120) and a surface finish is applied (block 1122) to form metallization layer 1200D of FIG. 12D.

The IC package with stacked die wire bond connections according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 13:
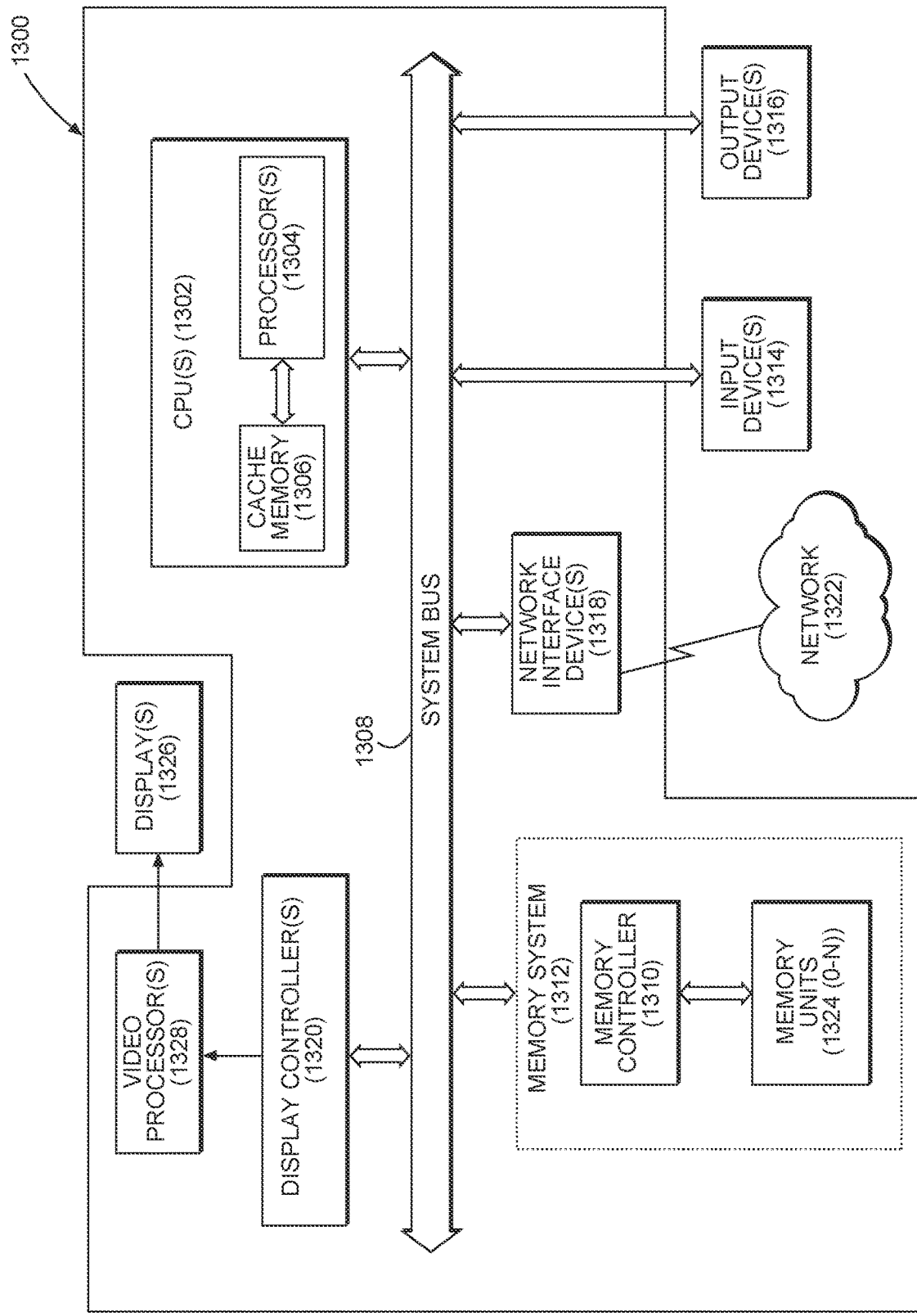
FIG. 13 is a block diagram of an exemplary processor-based system that can include the multiple chip packages having stacked die wire bond connections of FIGS. 2A and 3A.

More generally, in this regard, FIG. 13 illustrates an example of a processor-based system 1300 that can employ the IC packages illustrated in FIGS. 2A and 3A. In this example, the processor-based system 1300 includes one or more central processing units (CPUs) 1302, each including one or more processors 1304. The CPU(s) 1302 may have cache memory 1306 coupled to the processor(s) 1304 for rapid access to temporarily stored data. The CPU(s) 1302 is coupled to a system bus 1308 and can intercouple master and slave devices included in the processor-based system 1300. As is well known, the CPU(s) 1302 communicates with these other devices by exchanging address, control, and data information over the system bus 1308. For example, the CPU(s) 1302 can communicate bus transaction requests to a memory controller 1310 as an example of a slave device. Although not illustrated in FIG. 13, multiple system buses 1308 could be provided, wherein each system bus 1308 constitutes a different fabric.

Other master and slave devices can be connected to the system bus 1308. As illustrated in FIG. 13, these devices can include a memory system 1312, one or more input devices 1314, one or more output devices 1316, one or more network interface devices 1318, and one or more display controllers 1320, as examples. The input device(s) 1314 can include any type of input device, including, but not limited to, input keys, switches, voice processors, etc. The output device(s) 1316 can include any type of output device, including, but not limited to, audio, video, other visual indicators, etc. The network interface device(s) 1318 can be any devices configured to allow exchange of data to and from a network 1322. The network 1322 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1318 can be configured to support any type of communications protocol desired. The memory system 1312 can include one or more memory units 1324(0-N).

The CPU(s) 1302 may also be configured to access the display controller(s) 1320 over the system bus 1308 to control information sent to one or more displays 1326. The display controller(s) 1320 sends information to the display (s) 1326 to be displayed via one or more video processors 1328, which process the information to be displayed into a format suitable for the display(s) 1326. The display(s) 1326 can include any type of display, including, but not limited to, a cathode ray tube (CRT), a liquid crystal display (LCD), a plasma display, a light emitting diode (LED) display, etc.

Figure 14:
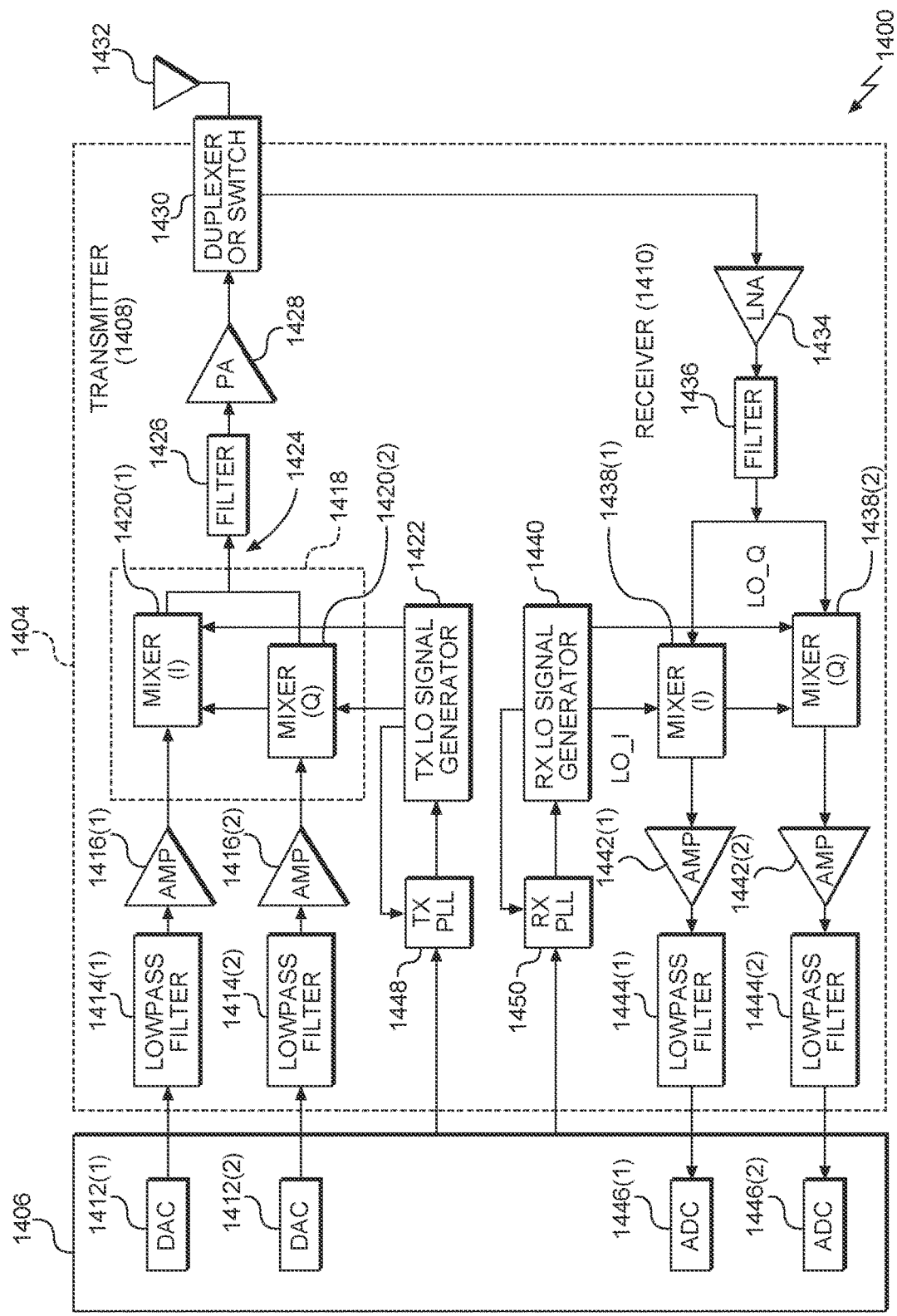
FIG. 14 illustrates an example of a wireless communications device which may be included in the processor-based system of FIG. 13 and may include the multiple chip packages having stacked die wire bond connections of FIGS. 2A and 3A.

FIG. 14 illustrates an example of a wireless communications device 1400 which can be used in the processor-based system of FIG. 13 and include the packages of FIGS. 2A and 3A. The wireless communications device 1400 may include or be provided in any of the above-referenced devices, as examples. As shown in FIG. 14, the wireless communications device 1400 includes a transceiver 1404 and a data processor 1406. The data processor 1406 may include a memory (not shown) to store data and program codes. The transceiver 1404 includes a transmitter 1408 and a receiver 1410 that support bi-directional communication. In general, the wireless communications device 1400 may include any number of transmitters and/or receivers for any number of communication systems and frequency bands. All or a portion of the transceiver 1404 may be implemented on one or more analog ICs, RF ICs (RFICs), mixed-signal ICs, etc.

A transmitter 1408 or a receiver 1410 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for a receiver 1410. In the direct-conversion architecture, a signal is frequency converted between RF and baseband in one stage. The super-heterodyne and direct-conversion architectures may use different circuit blocks and/or have different requirements. In the wireless communications device 1400 in FIG. 14, the transmitter 1408 and the receiver 1410 are implemented with the direct-conversion architecture.

In the transmit path, the data processor 1406 processes data to be transmitted and provides I and Q analog output signals to the transmitter 1408. In the exemplary wireless communications device 1400, the data processor 1406 includes digital-to-analog-converters (DACs) 1412(1) and 1412(2) for converting digital signals generated by the data processor 1406 into the I and Q analog output signals, e.g., I and Q output currents, for further processing.

Within the transmitter 1408, lowpass filters 1414(1), 1414(2) filter the I and Q analog output signals, respectively, to remove undesired images caused by the prior digital-to-analog conversion. Amplifiers (AMPs) 1416(1), 1416(2) amplify the signals from the lowpass filters 1414(1), 1414(2), respectively, and provide I and Q baseband signals. An upconverter 1418 upconverts the I and Q baseband signals with I and Q transmit (TX) local oscillator (LO) signals through mixers 1420(1), 1420(2) from a TX LO signal generator 1422 to provide an upconverted signal 1424. A filter 1426 filters the upconverted signal 1424 to remove undesired images caused by the frequency upconversion as well as noise in a receive frequency band. A power amplifier (PA) 1428 amplifies the upconverted signal 1424 from the filter 1426 to obtain the desired output power level and provides a transmit RF signal. The transmit RF signal is routed through a duplexer or switch 1430 and transmitted via an antenna 1432.

In the receive path, the antenna 1432 receives signals transmitted by base stations and provides a received RF signal, which is routed through the duplexer or switch 1430 and provided to a low noise amplifier (LNA) 1434. The duplexer or switch 1430 is designed to operate with a specific RX-to-TX duplexer frequency separation, such that RX signals are isolated from TX signals. The received RF signal is amplified by the LNA 1434 and filtered by a filter 1436 to obtain a desired RF input signal. Downconversion mixers 1438(1), 1438(2) mix an output of the filter 1436 with I and Q receive (RX) signals (i.e., LO_I and LO_Q) from an RX LO signal generator 1440 to generate I and Q baseband signals. The I and Q baseband signals are amplified by AMPs 1442(1), 1442(2) and further filtered by lowpass filters 1444(1), 1444(2) to obtain I and Q analog input signals, which are provided to the data processor 1406. In this example, the data processor 1406 includes analog-to-digital-converters (ADCs) 1446(1), 1446(2) for converting the analog input signals into digital signals to be further processed by the data processor 1406.

In the wireless communications device 1400 in FIG. 14, the TX LO signal generator 1422 generates the I and Q TX LO signals used for frequency upconversion, while the RX LO signal generator 1440 generates the I and Q RX LO signals used for frequency downconversion. Each LO signal is a periodic signal with a particular fundamental frequency. A transmit (TX) phase-locked loop (PLL) circuit 1448 receives timing information from the data processor 1406 and generates a control signal used to adjust the frequency and/or phase of the TX LO signals from the TX LO signal generator 1422. Similarly, a receive (RX) phase-locked loop (PLL) circuit 1450 receives timing information from the data processor 1406 and generates a control signal used to adjust the frequency and/or phase of the RX LO signals from the RX LO signal generator 1440.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered aspects:

1. An integrated circuit (IC) package comprising:
    a metallization structure comprising a metal layer; and
    an IC die coupled to the metal layer within the metallization structure through a wire bond connection and a via within the metallization structure.
2. The IC package of aspect 1, further comprising a second IC die disposed between the IC die and the metallization structure.

3. The IC package of aspect 2, wherein the IC die is coupled to the metal layer within the metallization layer through a second via.
4. The IC package of any previous aspect, further comprising a second IC die disposed on the IC die opposite the metallization structure and coupled to the metal layer within the metallization structure through a second wire bond connection and a second via.
5. The IC package of any previous aspect, further comprising a second metal layer on an exterior surface of the metallization structure, wherein the second metal layer couples to the via.
6. The IC package of aspect 5, wherein the wire bond connection is directly connected to the second metal layer.
7. The IC package of aspect 6, wherein the wire bond connection is directly connected to the second metal layer at a location spaced from an exterior edge of the metallization structure.
8. The IC package of any previous aspect, wherein the via comprises a blind via hole (BVH) via.
9. The IC package of any previous aspect, wherein the IC die comprises a memory die.
10. The IC package of any previous aspect integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.
11. An integrated circuit (IC) package, comprising:
    a metallization structure comprising:
    a first metal layer; and
    a second metal layer separated from the first metal layer;
    a first IC die adjacent to the metallization structure and coupled to the second metal layer; and
    a second IC die adjacent to the first IC die, the second IC die coupled to the second metal layer of the metallization structure through a via, wherein the first IC die is coupled to the second IC die through the second metal layer.
12. The IC package of aspect 11, further comprising a third IC die adjacent to the second IC die and positioned oppositely from the first IC die.
13. The IC package of aspect 12, wherein the third die is coupled to the first IC die through the second metal layer.
14. The IC package of any one of aspects 11-13, further comprising a contact pad in the first metal layer and wherein a wire bond connection is coupled to the contact pad.
15. The IC package of aspect 14, wherein the contact pad is spaced a distance from an exterior edge of the metallization structure.
16. The IC package of any one of aspects 11-15, further comprising a second via connecting the first IC die to the second metal layer.
17. The IC package of any one of aspects 11-16, wherein the via comprises a blind via hole (BVH) via.
18. The IC package of any one of aspects 11-17, wherein the first IC die is coupled to the second metal layer through a flip-chip connection.
19. The IC package of any one of aspects 11-18 wherein the first IC die comprises a modern circuit.
20. The IC package of any one of aspects 11-19, wherein the second die comprises a memory circuit
21. The IC package of any one of aspects 11-20 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.
22. The IC package of any one of aspects 13-21, wherein the first metal layer comprises a first contact pad and a second contact pad, wherein the second IC die couples to the via through the first contact pad and the third IC die couples to a second via through the second contact pad.
23. The IC package of aspect 22, wherein the second via couples to the second metal layer.
24. A method of fabricating an integrated circuit (IC) package, comprising:
    forming a metallization structure comprising a first metal layer and a second metal layer;
    connecting a contact pad in the first metal layer to the second metal layer through a via; and
    connecting an IC die to the contact pad through a wire bond connection.
25. The method of aspect 24, further comprising connecting a second IC die to the metallization structure through a flip-chip connection before connecting the IC die to the contact pad.
26. The method of aspect 25, wherein connecting the IC die to the contact pad comprises initially positioning the IC die on the second IC die.
27. The method of aspect 25 or 26, further comprising connecting the second IC die to the second metal layer through a second via.

What is claimed is:
1. An integrated circuit (IC) package comprising:
   a metallization structure comprising:
     a lower surface comprising a plurality of external contacts configured to couple the IC package to a circuit board;
     an interior metal layer;
     a surface metal layer positioned on an upper surface of the metallization structure opposite the lower surface, the surface metal layer comprising a contact pad; and
     a via coupling the surface metal layer to the interior metal layer, the via coupled to but laterally offset from the contact pad; and
   an IC die positioned above the upper surface of the metallization structure and coupled to the interior metal layer within the metallization structure through a wire bond connection coupled to the contact pad.

2. The IC package of claim 1, further comprising a second IC die disposed between the IC die and the metallization structure.

3. The IC package of claim 2, wherein the second IC die is coupled to the interior metal layer within the metallization structure through a second via.

4. The IC package of claim 1, further comprising a second IC die disposed on the IC die opposite the metallization structure and coupled to the interior metal layer within the metallization structure through a second wire bond connection and a second via.

5. The IC package of claim 1, wherein the contact pad is spaced from an exterior edge of the metallization structure.

6. The IC package of claim 1, wherein the via comprises a blind via hole (BVH) via.

7. The IC package of claim 1, wherein the IC die comprises a memory die.

8. The IC package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

9. An integrated circuit (IC) package, comprising:
 a metallization structure comprising:
  a lower surface comprising a plurality of external contacts configured to couple the IC package to a circuit board;
  a first surface metal layer positioned on an upper surface of the metallization structure opposite the lower surface; and
  a second metal layer separated from the first surface metal layer and positioned within the metallization structure;
 a first IC die positioned on the upper surface adjacent to the metallization structure and coupled to the second metal layer; and
 a second IC die adjacent to the first IC die, the second IC die coupled to the second metal layer of the metallization structure through a via and a contact pad in the first surface metal layer, wherein the contact pad is offset from the via and wherein the first IC die is coupled to the second IC die through the second metal layer.

10. The IC package of claim 9, further comprising a third IC die adjacent to the second IC die and positioned oppositely from the first IC die.

11. The IC package of claim 10, wherein the third IC die is coupled to the first IC die through the second metal layer.

12. The IC package of claim 9, further comprising a wire bond connection coupled to the contact pad.

13. The IC package of claim 12, wherein the contact pad is spaced a distance from an exterior edge of the metallization structure.

14. The IC package of claim 9, further comprising a second via connecting the first IC die to the second metal layer.

15. The IC package of claim 9, wherein the via comprises a blind via hole (BVH) via.

16. The IC package of claim 9, wherein the first IC die is coupled to the second metal layer through a flip-chip connection.

17. The IC package of claim 9, wherein the first IC die comprises a modem circuit.

18. IC package of claim 9, wherein the second IC die comprises a memory circuit.

19. The IC package of claim 9 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

20. The IC package of claim 11, wherein the first surface metal layer comprises a second contact pad, wherein the third IC die couples to a second via through the second contact pad.

21. The IC package of claim 20, wherein the second via couples to the second metal layer.

22. A method of fabricating an integrated circuit (IC) package, comprising:
 forming a metallization structure comprising:
  a first metal layer on an upper surface;
  a plurality of external contacts formed on a lower surface opposite the upper surface; and
  a second metal layer;
 connecting a contact pad in the first metal layer to the second metal layer through a via, wherein the contact pad is offset from the via;
 positioning an IC die over the upper surface of the metallization structure; and
 connecting the IC die to the contact pad through a wire bond connection.

23. The method of claim 22, further comprising connecting a second IC die to the metallization structure through a flip-chip connection before connecting the IC die to the contact pad.

24. The method of claim 23, wherein connecting the IC die to the contact pad comprises initially positioning the IC die on the second IC die.

25. The method of claim 23, further comprising connecting the second IC die to the second metal layer through a second via.

* * * * *